United States Patent [19]
Dion et al.

[11] Patent Number: 5,563,449
[45] Date of Patent: Oct. 8, 1996

[54] INTERCONNECT STRUCTURES USING GROUP VIII METALS

[75] Inventors: John Dion, Bolton, Mass.; Che-Yu Li, Ithaca; Peter Borgesen, Endicott, both of N.Y.

[73] Assignees: Cornell Research Foundation, Inc., Ithaca, N.Y.; Digital Equipment Corporation, Inc., Maynard, Mass.

[21] Appl. No.: 374,059

[22] Filed: Jan. 19, 1995

[51] Int. Cl.⁶ .................................................. H01L 29/40
[52] U.S. Cl. ........................ 257/764; 257/763; 257/765
[58] Field of Search .................................. 257/763, 764, 257/765; 428/610

[56] References Cited

U.S. PATENT DOCUMENTS

| | | | |
|---|---|---|---|
| 3,231,421 | 1/1966 | Schmidt | 437/197 |
| 3,239,376 | 3/1966 | Schmidt | 437/197 |
| 3,906,540 | 9/1975 | Hollins | 257/476 |
| 3,987,217 | 10/1976 | Greeson et al. | 437/194 |
| 4,176,443 | 12/1979 | Iannuzzi et al. | 437/192 |
| 4,507,851 | 4/1985 | Joyner et al. | 437/190 |
| 4,880,708 | 11/1989 | Sharma et al. | 428/620 |
| 5,134,460 | 7/1992 | Brady | 257/737 |
| 5,348,894 | 9/1994 | Gnade | 437/12 |

*Primary Examiner*—Kathryn Gorgos
*Assistant Examiner*—Brendan Mee
*Attorney, Agent, or Firm*—Jones, Tullar & Cooper, P.C.

[57] ABSTRACT

A multiple layer interconnect structure for a semiconductor chip includes a graded transition layer of tungsten and a Group VIII metal, such as palladium, platinum or nickel (Pd, Pt or Ni) which allows formation of a Group VIII metal interconnect on a conventional pad of Al or Al alloy. The graded transition layer is interfaced between a thin adhesion layer on the pad and the Group VIII metal interconnect, and is approximately 100% tungsten where it interfaces the adhesion layer and approximately 100% Group VIII metal where it interfaces the interconnect layer. The tungsten in the graded transition layer acts as a solder barrier and the Group VIII metal interconnect is compatible with the silicon substrate so that packaging processing steps, including lead soldering, can be carried out, and the chip electrically tested, in the semiconductor fabrication facility.

5 Claims, 1 Drawing Sheet

INTERCONNECT STRUCTURES USING GROUP VIII METALS

BACKGROUND OF THE INVENTION

The present invention relates to interconnect structures for semiconductor chips which employ Group VIII metals, such as palladium, platinum or nickel (Pd, Pt or Ni).

In the present state of the art of semiconductor fabrication, the chip or wafer formation process is completely separate from the interconnect formation process because of the incompatibility of the two processes. This is because the metal interconnects which are formed on the silicon chips for lead soldering are usually made of noble metals, including copper and gold, for example. Noble metals create an unwanted density of states within the band gaps of silicon and are therefore usually not allowed in the semiconductor fabrication facility's clean rooms where the silicon chips are formed. As a result, the interconnect formation and packaging of the silicon chips must be performed at a different manufacturing site which creates the need for additional clean rooms and therefore increases the packaging cost. This has also caused the thin film packaging process and equipment set to become dependent on, and compatible with, the standards set by the semiconductor chip fabrication facility. For example, the fabrication facility dictates the size of the fabricated wafers, and any change in the wafer size will require costly accommodation to the change by the packaging facility.

Although it has been previously proposed to remedy this problem by forming interconnects from metals other than noble metals, this solution has not been satisfactory because of compatibility problems with the aluminum or aluminum alloys which form the metal pads on the semiconductor chips. For example, metals such as Pt and Pd cannot be formed on top of a pad made from Al or Al alloy without the formation of brittle intermetallic compounds between the two metals which can compromise the integrity of the electrical connection.

SUMMARY OF THE INVENTION

To overcome the aforementioned drawbacks of prior art interconnects, the present invention provides an improved interconnect structure which employs non-noble metals and therefore can be formed in the same facility used to form the silicon chip on which the interconnect is formed. Further, the present invention provides a unique layered interconnect structure which allows the formation of non-noble metal interconnects on Al or Al alloy pads without formation of intermetallic compounds between the two.

In particular, the present invention is an interconnect structure in which the interconnect is formed from a Group VIII metal, such as Pd, Pt or Ni. To form the Group VIII metal interconnect over a pad made of Al or Al alloy without formation of intermetallic compounds between the two, two intermediate metal layers are employed. The first layer formed over the Al or Al alloy pad is an adhesion layer formed from a refractory metal or a compound of refractory metals, such as Ti, Cr, W, W-Ti or W-Cr. The next layer is a graded transition layer of tungsten (W) in combination with the Group VIII metal which forms the interconnect. The transition layer is graded so that it is approximately 100% W where it interfaces with the adhesion layer and is approximately 100% Group VIII metal where it interfaces with the Group VIII metal interconnect.

The use of W in the graded transition layer is advantageous because it acts as a diffusion barrier against both unwanted solid-state reactions (e.g., formation of intermetallic compounds) and liquid metal reactions which may occur during soldering of leads to the interconnects.

BRIEF DESCRIPTION OF THE DRAWINGS

The foregoing and other features and advantages of the present invention will became apparent from the following detailed description of a preferred embodiment thereof, taken in conjunction with the accompanying drawing figures, in which.

DETAILED DESCRIPTION OF THE PREFERRED EMBODIMENTS

Figure 1:
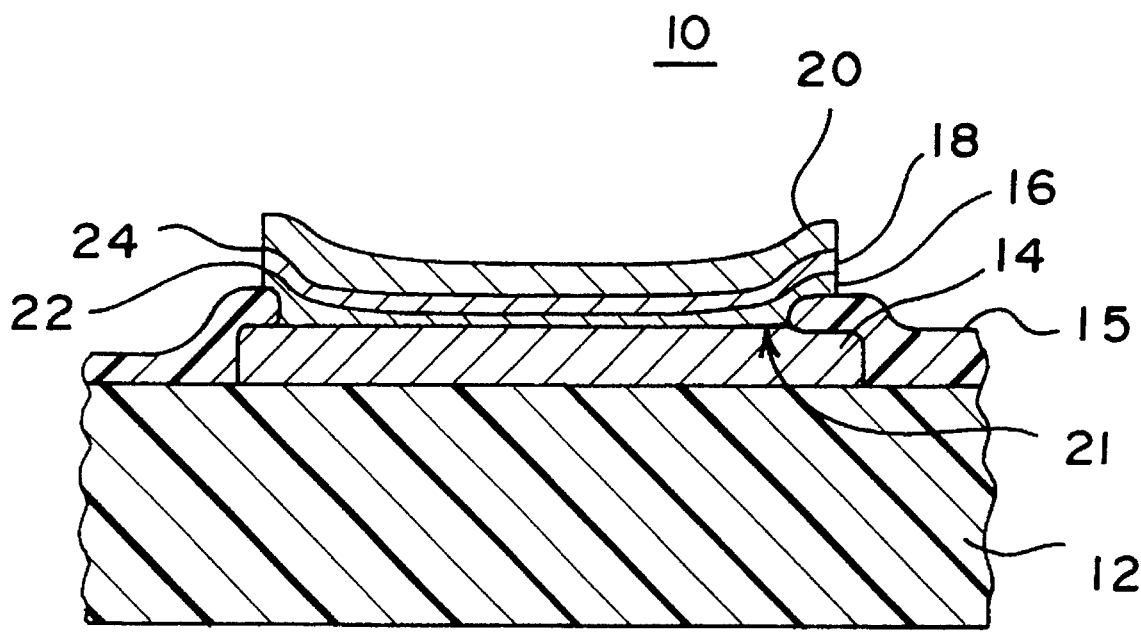
FIG. 1 is a cross sectional side view of an interconnect structure constructed in accordance with the present invention; and, FIG. 2 is a top plan view of the interconnect structure of FIG. 1 showing some layers in phantom.

Turning now to a detailed consideration of a preferred embodiment of the present invention, FIG. 1 illustrates an interconnect structure 10 which is formed on a silicon substrate 12 of a semiconductor wafer or chip. The interconnect structure 10 includes an Al or Al alloy pad 14, a thin film silicon nitride or silicon dioxide passivation layer 15, a thin adhesion layer 16, a graded transition layer 18 and an interconnect layer 20. All of the various layers are preferably formed using conventional vapor deposition techniques, such as CVD or sputtering.

Figure 2:
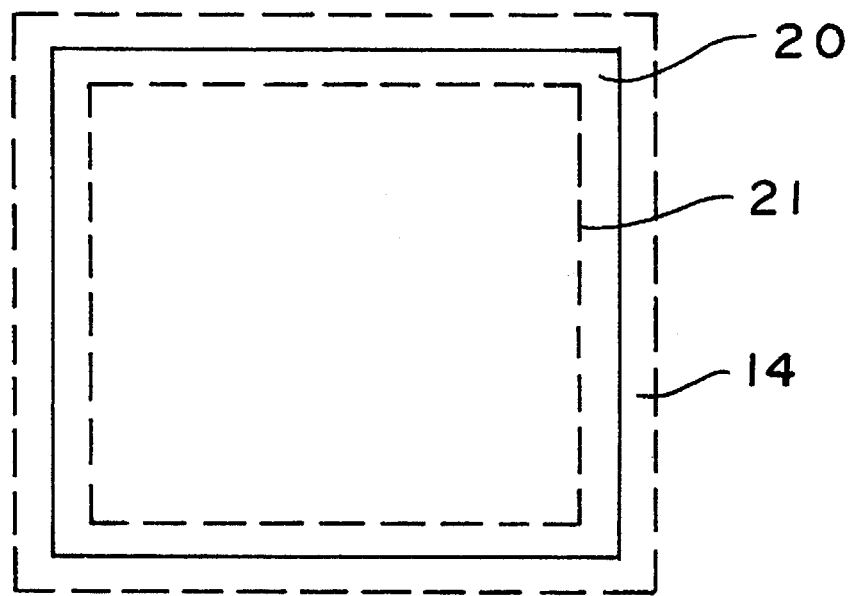

As illustrated in FIG. 2, a passivation window 21 is formed in the passivation layer 15 over most of the surface area of the Al or Al alloy pad 14, and has edges that overlap the edges of the pad 14. The window 21 allows the thin adhesion layer 16 to be deposited in electrical and physical contact with the pad 14. As shown in FIGS. 1 and 2, the three layers 16, 18 and 20 overlap the edges of the passivation window 21.

The adhesion layer 16 is preferably formed from a refractory metal, preferably W, or a compound of W with other refractory metals, including Ti, Cr and Mo. Examples of these compounds include Ti with up to 20% by weight W, Cr with up to 3% by weight W, and Mo with any amount of W up to 100%. The adhesion layer 16 is preferably between 100 and 500 angstroms thick.

The graded transition layer 18 is formed from a mixture of W and a Group VIII metal, such as Pd, Pt or Ni and is preferably approximately 0.5 micron thick. The gradation of the transition layer 18 is chosen so that at the interface between the adhesion layer 16 and the transition layer 18, the composition of the transition layer 18 at a bottom portion 22 thereof is approximately 100% W, while at the interface between the transition layer 18 and the interconnect layer 20, the composition of a top portion 24 thereof is approximately 100% the chosen Group VIII metal.

W is preferred in the transition layer 18 because it has the highest melting temperature of any refractory metal and will not react with the underlying Al pad 14, thereby precluding the formation of intermetallic compounds between the two. Further, W slows the reaction of molten solder used to attach leads to the interconnect layer 20 so that the solder will not penetrate the transition layer 18 and adversely affect either the Al pad 14 or the silicon substrate 12. W makes a particularly suitable stop to molten solder wetting reactions with the use of all types of solder including Sn and Pb based solders, as well as Pb-free solders which typically use In and/or Bi as substitutes, because W is insoluble with all of these elements.

The interconnect layer 20 is formed from pure Group VIII metal which is chosen to be the same Group VIII metal contained in the transition layer 18. These metals therefore include Pd, Pt or Ni. The thickness of the interconnect layer 20 is chosen to be approximately 1 micron. Pd is preferred because it is known to oxidize very slowly and is readily resolderable. Most importantly, Pd and Pt are commonly used as silicides and are welcome in today's semiconductor fabrication facilities, as are all of the metals proposed here for use in the interconnect structure 10.

Another advantage of using Pd on top of an Al pad or in place of Au, is that it is harder than Au and will not scuff during electrical testing with a test probe. Further, since it is placed on top of, and overlaps, the passivation window, there is a greater margin for test probe misalignment because the esposed surface area of the interconnect layer 20 is greater than that of the Al pad. This metal is also compatible with needle tip and bumped-membrane testing techniques and will undoubtedly be compatible with other emerging test-at-speed technology. The hardness advantage of Pd has been utilized in connectors since it provides excellent wear. Such metallurgy should likewise be compatible with new separable connectors. Finally, Pd is compatible with some lead-free solders which can be soldered with a non-activated or water white rosin flux requiring no clean up.

The present invention therefore provides a new Pd or Pt-based interconnect structure which can be processed in the semiconductor fabrication facility and is compatible with known and most likely future testing techniques and solder joining methods. This allows the semiconductor circuits to be fabricated, tested and reworked, if necessary, all in the same clean room, thereby resulting in substantial cost and time savings.

Although the invention has been disclosed in terms of a preferred embodiment, it will be understood that numerous variations and modifications could be made thereto without departing from the scope of the invention as defined in the following claims.

What is claimed is:

1. An interconnect structure for making electrical connections to a semiconductor circuit chip comprising:
   a) a silicon substrate layer;
   b) a pad layer disposed on said silicon substrate layer, said pad layer being formed from aluminum or an aluminum alloy;
   c) an adhesion layer disposed on said pad layer;
   d) a graded transition layer disposed on said adhesion layer, said graded transition layer being formed from a combination of tungsten and a Group VIII metal wherein said graded transition layer has a bottom portion engaging said adhesion layer which is composed approximately 100% of W and a top portion composed approximately 100% of said Group VIII metal; and,
   e) a metal interconnect layer disposed on said graded transition layer and composed of the same Group VIII metal contained in said graded transition layer.

2. The interconnect structure of claim 1 wherein said Group VIII metal in said graded transition layer and said interconnect layer is chosen from the group consisting of Pd, Pt or Ni.

3. The interconnect structure of claim 2 wherein said adhesion layer is formed from refractory metal.

4. The interconnect structure of claim 3 wherein said refractory metal is selected from the group consisting of W, Ti, Cr, Mo or a mixture of W and Ti, W and Cr or W and Mo.

5. The interconnect structure of claim 1, wherein said pad layer includes a plurality of edges, and wherein said interconnect structure further includes a passivation layer disposed on said pad layer with a passivation window formed therein having edges which overlap the edges of said pad layer, wherein said adhesion layer, graded transition layer and metal interconnect layer are disposed over said passivation window and have edges which overlap the edges of the passivation window.

\* \* \* \* \*